United States Patent [19]

Cherry

[11] Patent Number: 4,780,670
[45] Date of Patent: Oct. 25, 1988

[54] ACTIVE PROBE CARD FOR HIGH RESOLUTION/LOW NOISE WAFER LEVEL TESTING

[75] Inventor: Robert S. Cherry, Redondo Beach, Calif.

[73] Assignee: Xerox Corporation, Stamford, Conn.

[21] Appl. No.: 707,937

[22] Filed: Mar. 4, 1985

[51] Int. Cl.⁴ .................. G01R 1/06; G01R 31/01
[52] U.S. Cl. .................. 324/158 P; 324/158 F; 324/73 PC
[58] Field of Search .......... 324/158 P, 158 F, 73 PC, 324/72.5, 158 R

[56] References Cited

U.S. PATENT DOCUMENTS

| | | | |
|---|---|---|---|
| 3,319,166 | 5/1967 | Coleman | 324/158 R |
| 3,596,228 | 7/1971 | Reed, Jr. | 324/158 P |
| 3,835,381 | 9/1974 | Garretson et al. | 324/158 P |
| 3,849,728 | 11/1974 | Evans | 324/158 F |
| 4,219,771 | 8/1980 | Reid et al. | 324/158 P |
| 4,382,228 | 5/1983 | Evans | 324/158 F |
| 4,414,506 | 11/1983 | Kelley | 324/158 P |
| 4,480,223 | 10/1984 | Aigo | 324/72.5 |
| 4,507,605 | 3/1985 | Geisel | 324/73 PC X |
| 4,574,235 | 3/1986 | Kelly et al. | 324/158 F X |
| 4,626,775 | 12/1986 | Cho et al. | 324/158 F X |
| 4,672,312 | 6/1987 | Takamine et al. | 324/158 P X |

FOREIGN PATENT DOCUMENTS 56-76064 6/1981 Japan.
WO80/00101 1/1980 PCT Int'l Appl. ............ 324/158 F
2014743 8/1979 United Kingdom.

OTHER PUBLICATIONS

"Fixed Probe Cards"; Wentworth Laboratories; pp. 1-3.
"Multiple Contact Probe"; RCA-TN No. 745; Jan. 1968.
Lorber et al; "Non-Adhering Probe for Contacting Solder Pads"; IBM Technical Disclosure 1983; p. 251.
Castro; "AC Probe Contactor"; IBM Technical Disclosure 1977; p. 2689.

Primary Examiner—Reinhard J. Eisenzopf
Assistant Examiner—Vinh P. Nguyen
Attorney, Agent, or Firm—Franklyn C. Weiss

[57] ABSTRACT

An active probe card for high resolution/low noise wafer level testing wherein integrated circuits, such as charge coupled device imagers are tested at the wafer level before initial packaging. The probe card contains active logic and power circuits thereon with improved pin probe needles to reduce noise and distortion. The edge card connectors are eliminated and standard connectors would be used. In addition, the output signal is buffered on the probe card to reduce the effects of loading caused by the patch cable and the measuring instrument.

2 Claims, 1 Drawing Sheet

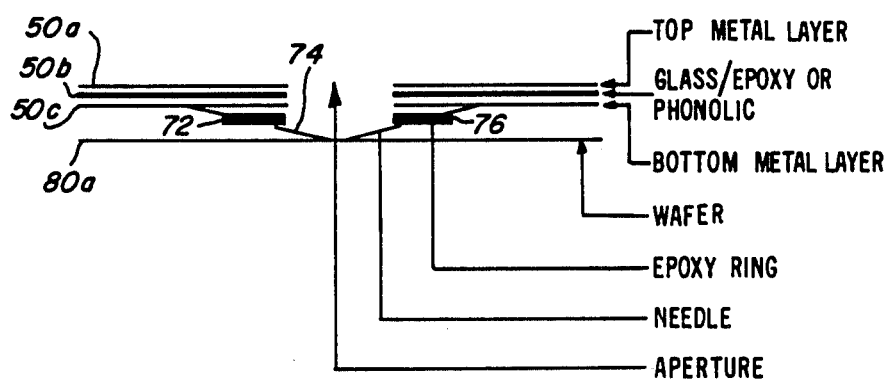
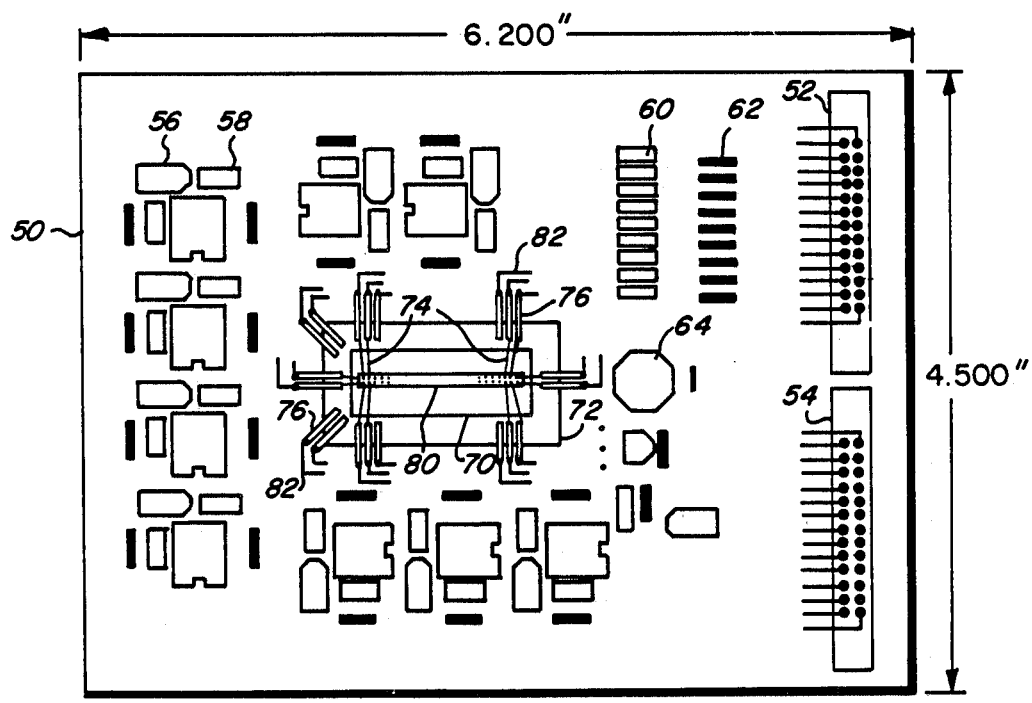

ACTIVE PROBE CARD FOR HIGH RESOLUTION/LOW NOISE WAFER LEVEL TESTING

This invention relates to the testing of high resolution/low noise integrated circuit devices, for example, charge coupled devices, wherein the integrated circuit devices are tested at the wafer level utilizing a probe card with active circuits thereon including improved pin probe devices which improve the testing connections to the device under test (DUT).

BACKGROUND OF THE INVENTION

Before integrated circuits can be marketed, they must be tested in order to insure accurate and complete operation. Many methods are utilized for testing integrated circuits, including initial DC testing of the wafer, and then testing the wafer at the AC level including testing the circuit functionally. Those integrated circuits on the wafer that pass these initial tests are then packaged in the standard industry dual-in-line or other packages and undergo even further testing. Many integrated circuits will be needlessly packaged, however, because prior art testing at the wafer level is inaccurate due to the high noise level in the output test signal from the DUT. Unfortunately, if an integrated circuit device is defective, then much expense has been expended in packaging the integrated circuit chip and including it in the testing process.

For highly sensitive devices, such as charge coupled devices (CCD), it may be simpler and less expensive to test the DUT prior to packaging or at least prior to completion of the packaging when the chip is sealed within an integrated circuit housing.

Commercial machines are available for testing at this level, also, and provide for apparatus upon which the chip may be applied, and with external probe pins, apply signals to and receive output from the integrated circuit chip at predesignated pads on the integrated circuit chip. The probe cards, as they are known by, are akin to printed circuit boards with edge fingers so that the cards can be interchangeable with other cards to test different integrated circuit devices. These probe cards are typically two layers fabricated with a fiberglass or phenolic material. These cards do not incorporate any type of ground plane or central ground system. Many cards are designed to use jumper wires which parallel each other and are long in length. Unfortunately, many or all of these factors contribute to the inherent noise of the conventional probe card. Obviously, increased noise to he output of the system detracts from the testing process of the integrated circuit chip itself, as the DUT output signal, being inaccurate, does not truly depict the accuracy of the signal generated by the integrated circuit chip itself. The output signals from the device under test (DUT), in typical prior art testing apparatus, must travel through the blade connection to the probe card and on through long jumper wires to the edge connector onto the drive board where it finally connects to a high capacitance cable between the driver board and the measuring test instrument. The loading of this signal path causes tremendous degradation of the output signal, thus accurate measurements of this signal from the device under test are impossible.

According to the present invention, a unique customer active wafer probe card is utilized to test an integrated circuit device such as a charge coupled device. The card is unique in that all clock drivers would be located on the probe card itself, with the driver output tied directly to the probe element to reduce the noise and distortion effects caused by long cable lengths. All dc lines would have decoupling capacitors located on the probe card. The ac and dc signal paths would be isolated by a third layer ground plane placed between the ac and dc layers. The edge card connectors would be eliminated and standard berg type connectors would be used instead. The output signal would be buffered on the probe card to reduce the effects of loading caused by the patch cable and the measuring instrument. Accordingly, the DUT may bypass much of the prior art wafer level testing and proceed from testing at the DC probe level directly to the testing after packaging because most inherently defective integrated circuits will be uncovered by the technique and apparatus discussed herein.

DESCRIPTION OF THE DRAWINGS

For a more complete understanding of the invention, reference may be had to the following detailed description of the invention in conjunction with the drawings wherein:

FIG. 1 is a side view of the epoxy ring probe card construction at the aperture of the card; and FIG. 2 is a top view of the active probe card of the present invention showing the layout of the components, the aperture, input and output connections, the probe fingers, and where a DUT would be placed in relation to the fingers.

DETAILED DESCRIPTION OF THE INVENTION

The normal prior art method of testing charge coupled devices could utilize a product manufactured by Wentworth Laboratories, Brookfield, Conn. Such apparatus provides a support for an integrated circuit wafer. A typical wafer would include many reproductions of the same integrated circuit DUT on one wafer. In one instance, utilizing CCDs, a typical wafer could include 30 to 40, or more, charge coupled devices (CCD). The wafer would be placed on the support and held in place by a pneumatic vacuum system provided within the testing apparatus. The support would then be moved beneath a test card which, in the prior art, only has printed circuit wires on a fiberglass or other type of insulating member, typical in the printed circuit board art. In the center of the printed circuit board would be an aperture into which a plurality of metal or ceramic fingers, i.e. pins, extend and are positioned very accurately such that when the support holding the wafer card by vacuum is raised into position, the accurate placement by the testing apparatus would cause the probe fingers to come into contact with certain predetermined conducting pads on the DUT. The circuitry for driving and amplifying signals from the tested device, in the prior art devices, are entirely off the printed circuit card. The exceptional lead length distance plus the typical prior art placement of the input and output printed circuit wires on the card, plus the normal friction type of edge connector for printed circuit connections, all add an extraordinarily large amount of noise into the system which interferes with the accurate testing of the device. Thus, an operator testing a plurality of devices may not be able to distinguish the difference between noise generated due to extreme lead length and noise generated by the friction edge connectors, etc., from noise generated due to an inherently bad device. Commercial testing machines have interval stepping apparatus for stepping the wafer from DUT to DUT with accurate placement in the vertical direction of each said DUT to the probe pins for testing of subsequent CCD.

The disclosed invention, on the other hand, provides for a significant noise reduction by putting the testing circuitry and amplification circuitry as close to the DUT being tested on the wafer itself. For example, FIG. 2 of the present application shows a printed circuit board card 50 with a power connection 52 and a logic connection 54. These would not be the typical edge connections that would normally occur for printed circuit boards, but could comprise much more accurate, lower noise connector types well known in the prior art. The printed circuit board seen in FIG. 2 is a composite, but incomplete for purposes of clarity, test circuit so as to easily point out the features that would involve a complete printed circuit board and testing device. Designations 56, 58, 60, and 62 show where specific components could go on the printed circuit board with, for example, designation 60 comprising a plurality of capacitors, while designation 62 could comprise a plurality of resistors. The octagonal shape 64 seen to the right in the middle section of the printed circuit board schematically shows where the output connection reduction.

Seen in FIG. 2 is rectangular aperture 70. Surrounding the aperture is an epoxy ring 72 which is provided for the mounting of the needle probe pins 74. The rectangles 76 provide an electrical path from the needle probes 74 which are mounted to the epoxy ring 72 to allow the application of an electrical signal to and from the DUT 80. The rectangles 76, which provide the electrical connection between the printed circuit board and the needles 74, are connected to printed circuit board wiring 82 which would lead the signals to and from the various circuitry provided on the printed circuit board. Most of the printed circuit board wiring has been eliminated so that the shape of the board, the position of the aperture, the needle probe pins, the DUT, and certain of the printed circuit board wiring leading to and from the pins can clearly be seen. Only eight actual pins 74 are shown in FIG. 2 but each one of the rectangles 76 would have a pin connected to it and, further, there would be more rectangles 76 providing anchoring of the pins to the board depending on the number of test pads chosen for any particular integrated circuit under test. If a different DUT, for example, a CCD array or other type integrated circuit is to be tested, then board 50 would be removed from the commercial testing apparatus and a different, but similar, board would be mounted to the testing apparatus and different power and logic leads connected to terminals 52 and 54. Further operation would be similar to that for the DUT described above.

FIG. 1 of the present application shows a side view of the printed circuit board and a typical wafer and the relative positioning of the various aspects thereof. Circuit board 50 in FIG. 1 would have a top metal layer 50a, shown in FIG. 1 in various configurations as prior art type of printed circuit board leads as is well known. The board itself would comprise a glass/epoxy or a phenolic resin 50b. The bottom layer 50c comprises the lower printed circuit board wiring level, thus making up a two-sided integrated circuit printed wiring board.

The top metal layer could be the ac wiring level while the bottom metal layer could be the dc wiring plane to separate the ac from the dc components thereof or vice versa. The wafer 80a is shown in cross section in FIG. 1 spaced away from the printed circuit board 50. It would be supported by the vacuum stand or support in the commercial testing apparatus. This apparatus is not shown in FIG. 1 for clarity and because this apparatus is well known in the prior art. The wafer would be raised vertically or in the direction of the top of the paper in order to come in contact with the various fingers 74. Epoxy ring 72 is clearly seen in FIG. 1 to which the fingers 74 are attached. To provide a connection between the fingers 74 and the various printed circuit board wiring circuits on the printed circuit board, connection 76 is shown which are the rectangles 76 seen in FIG. 2.

Typical dimensions could be the pads for the needles on the integrated circuit array would be approximately 30 mils wide and a minimum of 50 mils in length, from aperture edge to bond location. The probe needles could be 10 mils in diameter and may be bent as they pass through the ring. The epoxy ring is 200 mils wide, in typical dimension. The card could also have approximately a 200 mil clearance around the perimeter to insure that it will not short out to the card holder on the probe station. A mil is one thousandth of an inch. Typical dimensions for the printed circuit board itself, are as follows:

| PARAMETER | DIMENSION | UNITS | TOLERANCE |
| --- | --- | --- | --- |
| Board Width | 4.500 | Inch | ±0.050 |
| Board Length | 6.000 | Inch | +4.000.−0.500 |
| Epoxy Ring width (ID to OD) | 200 | mil | ±10 |
| Pad for needle bond width | 30 | mil | ±5 |
| Pad for needle bond width | 500 | mil | ÷250.−10 |
| Chip pad to edge of aperture width | 200 | mil | ÷50 |
| Chip pad to edge of aperture length | 200 | mil | +50 |
| Copper weight | 1 | pound | N/A |
| Nickle Plating | 0.500 | mil | ±0.050 |
| Gold Plating | 0.050 | mil | ±0.010 |
| Needle Diameter at shaft | 10.000 | mil | ÷1.000 |
| Needle tip shape | User Defined: point or flat | | |

Thus, in operation, the operator would load the wafer onto the vacuum support, move the support under the aperture in the printed circuit board, raise the wafer (obviously the wafer could be stationary and the circuit board lowered), until the probe pin needles come into contact with the predetermined pads on each integrated board, in this case, a CCD array. The various testing can be accomplished now at this point, with those arrays that are defective being marked so that when the arrays are cut apart, the defective arrays can be discarded.

While the invention has been described with reference to specific embodiments, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. An active integrated circuit probe card for use in testing integrated circuit wafer devices comprising:
printed circuit board means including circuit means mounted on said board means utilized for providing power and other signals to and receiving test signals from an integrated circuit wafer under test, said printed circuit board means having an aperture formed in said board of predetermined size to accommodate an integrated circuit wafer under test, a plurality of probe needle means surrounding and extending into said aperture and onto said integrated circuit wafer, one end of each probe needle means being fixedly attached to the printed circuit board means and electrically connected to said circuit means, said printed circuit board means comprising a substrate material containing a central ground plane shield, a top metal layer in a predetermined wiring configuration, a bottom metal layer in a predetermined wiring configuration, said top layer being the AC signal wiring level while said bottom level is the DC signal wiring level, wherein the AC and DC signals are isolated by the center ground plane layer which is insulated from the AC and DC layers by the substrate material layers.

2. The probe card as set forth in claim 1 wherein said aperture in said printed circuit board means is surrounded by epoxy or other similar securing means to allow said probe needle means to be secured directly to said printed circuit board means.

* * * * *